US006657494B2

(12) United States Patent
Twomey

(10) Patent No.: US 6,657,494 B2
(45) Date of Patent: Dec. 2, 2003

(54) VARIABLE GAIN MIXER-AMPLIFIER WITH FIXED DC OPERATING VOLTAGE LEVEL

(75) Inventor: Gerald J. Twomey, Escondido, CA (US)

(73) Assignee: International Business Machines Corporation, Armonk, NY (US)

(*) Notice: Subject to any disclaimer, the term of this patent is extended or adjusted under 35 U.S.C. 154(b) by 144 days.

(21) Appl. No.: 09/968,348

(22) Filed: Sep. 28, 2001

(65) Prior Publication Data

US 2003/0062951 A1 Apr. 3, 2003

(51) Int. Cl.[7] .................................................. H03F 3/45
(52) U.S. Cl. ........................ 330/254; 327/359; 330/252
(58) Field of Search ................................ 330/254, 252, 330/288, 278, 253; 327/359, 52, 53; 326/127

(56) References Cited

U.S. PATENT DOCUMENTS

| 3,970,774 | A | | 7/1976 | Bazin et al. | |
|---|---|---|---|---|---|
| 4,374,335 | A | | 2/1983 | Fukahori et al. | |
| 4,706,045 | A | | 11/1987 | Ouyang et al. | |
| 5,057,787 | A | * | 10/1991 | Arai et al. ................... | 330/254 |
| 5,157,559 | A | | 10/1992 | Gleason et al. | |
| 5,515,014 | A | | 5/1996 | Troutman | |
| 5,546,050 | A | | 8/1996 | Florian et al. | |
| 5,587,687 | A | | 12/1996 | Adams | |
| 5,589,791 | A | | 12/1996 | Gilbert | |
| 5,635,863 | A | | 6/1997 | Price, Jr. | |
| 5,768,700 | A | | 6/1998 | Kardontchik | |
| 5,826,182 | A | | 10/1998 | Gilbert | |
| 5,847,623 | A | | 12/1998 | Hadjichristos | |
| 5,926,749 | A | | 7/1999 | Igarashi et al. | |
| 5,990,741 | A | * | 11/1999 | Yamamoto et al. ......... | 330/253 |
| 6,029,059 | A | | 2/2000 | Bojer | |
| 6,029,060 | A | | 2/2000 | Ashby | |
| 6,041,080 | A | | 3/2000 | Fraisse | |
| 6,043,943 | A | | 3/2000 | Rezzi et al. | |
| 6,057,714 | A | | 5/2000 | Andrys et al. | |
| 6,163,215 | A | * | 12/2000 | Shibata et al. .............. | 330/254 |
| 6,437,631 | B2 | * | 8/2002 | Amano ....................... | 327/359 |

FOREIGN PATENT DOCUMENTS

GB   2 334 163 A   8/1999

* cited by examiner

Primary Examiner—Brian Young
Assistant Examiner—John Nguyen
(74) Attorney, Agent, or Firm—Blakely, Sokoloff, Taylor & Zafman LLP

(57) ABSTRACT

To provide a mixer/amplifier capable of providing variable gain while maintaining a substantially constant common mode operating voltage level and to maintain a substantially constant operating voltage in new, low voltage designs and to provide a mixer/amplifier in low-power direct conversion receiver. A low noise amplifier is provided in which a gain control signal is provided through a differential current source. Two output currents I1 and I2 are provided. I1+I2=a constant. I1 and I2 are mirrored in first and second paths, one including amplifier transistors and optionally a Gilbert cell multiplier. Irrespective of amplifier gain, the current through the two paths remains equal to I1 and I2, and common mode voltage remains constant.

11 Claims, 2 Drawing Sheets

VARIABLE GAIN MIXER-AMPLIFIER WITH FIXED DC OPERATING VOLTAGE LEVEL

FIELD OF INVENTION

The present invention relates to variable gain mixers and amplifiers, particularly in direct conversion transceivers.

BACKGROUND OF THE INVENTION

The present invention finds application in many contexts. Direct conversion transceivers, in which conversion between a radio frequency signal and a modulation or demodulation frequency is done in one stage, are gaining increasing importance. Direct conversion transceivers draw less power than multistage receivers. Since the direct conversion receiver has low frequency output, AC coupling between stages is not viable. Consequently DC isolation of an amplifier or mixer stage is not possible.

It is highly desirable to be able to be able to change gain of an amplifier or mixer while keeping the common mode operating point constant. This is difficult in a non-isolated stage. Improved designs concentrate on drawing less power. Lower supply voltages, 2.5, 2.7 volts, are being utilized than in the past. With smaller supply voltages, smaller variations in common mode operating level represent a greater percentage variance. Also, fewer components can be stacked between power and ground.

SUMMARY OF THE INVENTION

It is therefore an object of the present invention to provide a mixer/amplifier capable of providing variable gain while maintaining a substantially constant common mode operating voltage level. It is a further object of the present invention to maintain a substantially constant operating voltage in new, low voltage designs. It is a more specific object, in one form, to provide a mixer/amplifier in low-power direct conversion receiver.

Briefly stated, in accordance with the present invention, a low noise amplifier is provided in which a gain control signal is provided through a differential current source. Two output currents I1 and I2 are provided. I1+I2=a constant. I1 and I2 are mirrored in first and second paths, one including amplifier transistors and optionally a Gilbert cell multiplier. Irrespective of amplifier gain, the current through the two paths remains equal to I1 and I2, and common mode voltage remains constant.

BRIEF DESCRIPTION OF THE DRAWINGS

The method and means by which the foregoing invention are achieved are pointed out with particularity in the claims forming the concluding portion of the specification. The invention, both as to its organization and manner of operation may be further understood by reference to the following description taken in connection the following drawings.

DETAILED DESCRIPTION OF THE INVENTION

Figure 1:
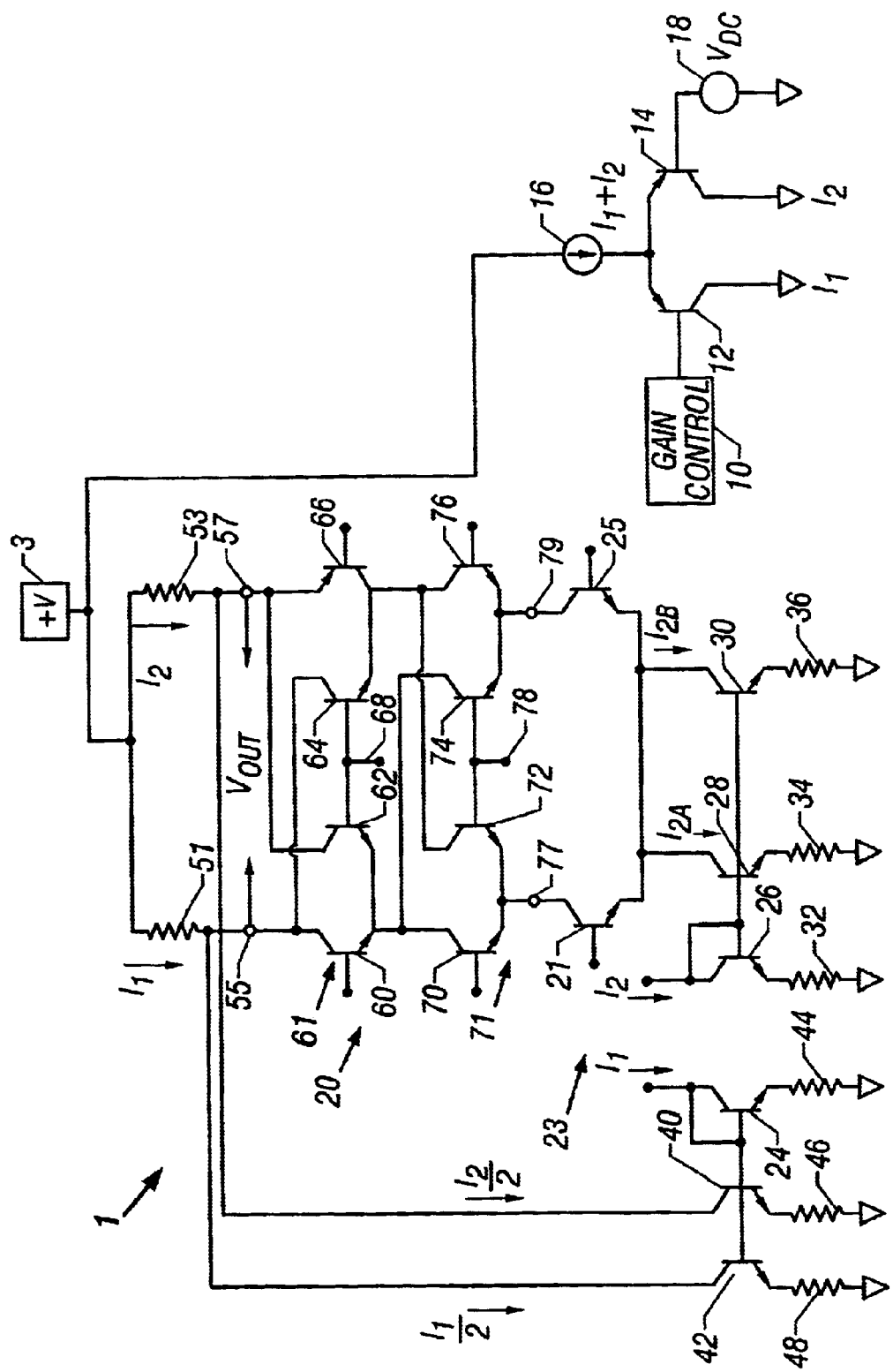
FIG. 1 is a schematic illustration of a variable gain mixer amplifier and affixed to DC output operating point constructed in accordance with the present invention.

FIG. 1 is a schematic illustration of a variable gain mixer 1 with a fixed DC operating output operating point. The operating point is a voltage level. It should be noted that while the transistors illustrated in FIG. 1 are bipolar, CMOS devices may be used as well. Voltage is supplied to the variable gain mixer 1 from a voltage source 3.

A gain control signal source 10 supplies a gain control signal to a differential pair of transistors 12 and 14. The differential transistors 12 and 14 have their collectors connected together to be supplied by a current source 16 supplied by the voltage source 3. The current source is selected to provide a current $I_1+I_2$. The gain control signal is connected to the base of transistor 12, and a fixed source providing a voltage $V_{DC}$ 18 biases the base of the transistor 14.

The currents I1 and I2 are mirrored into two current mirror reference diodes 24 and 26.

Variable gain control is provided for a mixer block 20 and amplifier 23 stacked between the voltage source 3 and ground. In the present description, "above" is used to denote closer to the voltage source 3 and "below" is used to denote closer to ground in terms of both distance in the diagram and potential level. $I_1+I_2$ remain equal to I, the current supplied by the current source 16.

I1 and I2 are mirrored into two current mirror reference diodes transistors 24 and 26 respectively connected in a diode configuration with their bases and collectors tied together. Transistors 28 and 30 have their bases connected to the base of the transistor 26 and their collectors connected to the bottom of the amplifier circuit 23. Resistors 32, 34 and 36 are respectively connected between the collectors of the transistors 26, 28 and 30 and ground. The current through the transistors 28 and 30 are I2A and I2B respectively. I2A+I2B=I2. Similarly, transistors 40 and 42 have their bases connected to the base of the transistor 24. Resistors 44, 46 and 48 are respectively connected between the emitters of the transistors 24, 40 and 42 and ground. The current through the transistor 42 is I1/2, and the current through the transistor 40 is I2/2.

Resistors 51 and 53 are connected between the voltage source 3 and collectors of the transistors 40 and 42 respectively. Lower terminals of the resistors 51 and 53 respectively are connected to a top of the mixer block 20. Lower terminals 55 and 57 of the resistors 51 and 53 respectively comprise output terminals of the mixer block 20. A first channel 61 of the mixer block 20 comprises transistors 60, 62, 64 and 66 coupled in a conventional manner. The emitters of the transistors 60 and 62 are tied together to a terminal 67 and the transistors 64 and 66 have their collectors connected together to a mid-terminal 69. The collectors of transistors 60 and 64 are connected together to the upper terminal 55 and the collectors of the transistors 62 and 66 are connected to the upper terminal 57. Another Gilbert cell channel 71 is provided comprising transistors 70, 72, 74 and 76. A terminal 68 is intermediate the basis of transistors 62 and 64.

A terminal 78 is intermediate the basis of the transistors 72 and 74, which are connected together. The transistors 70 and 74 have their collectors connected together at mid-terminal 67, while the transistors 72 and 76 have their collectors connected together at the mid-terminal 69. Emitters of the terminal 70 and 72 are connected together at a lower terminal 77 and emitters of the transistors 74 and 76 are connected together at a lower terminal 79.

In the first channel 61, generally an I or in phase channel, a mixer frequency is applied at the terminal 64 and a differential input is applied to the base of the transistors 60 and 66. Similarly, in the second channel 71, generally a Q or quadrature channel, the mixer input frequency is applied to the terminal 78, while a differential input signal is applied to the basis of the transistors 70 and 76.

In the amplifier 23, a transistor 25 has its collector connected to the lower terminal 77 and its emitter connected to the transistor 24. Similarly, the transistor 25 has its emitter connected to the lower terminal 79 and its emitter connected to the transistor 30.

In operation, I1 and I2 are ideally direct current and in practice have a low frequency. A common mode Vout is maintained across the terminals 56 and 57. In the low gain mode, the gain control source 10 biases the transistor I2 so that I1 is much greater than I2. Similarly, gain control source 10 renders the transistor 12 less conductive than the bias from the source 18 to the base of the transistor 14. Consequently, I2 is much greater than I1. In each case I1+I2 remains constant. The currents through the transistors 28 and 30, respectively I2A and I2B establish the current through the differential pair of amplifier transistors 24 and 25. In high gain situations, most of the current in the mixer amplifier goes through the amplifier 23. In low gain situations, smaller amounts of current go through the amplifier 23.

When gain changes, the voltage Vout across the terminals 55 and 57 would change without compensation. Compensation is provided by current through the transistors 40 and 42, which are connected to the terminals 57 and 55 respectively. The currents I1/2 and I2/2 are provided through the transistors 42 and 40. The currents in parallel circuits added together at the terminals 55 and 57 remain constant. Redirection of the currents I1/2 and I2/2 around the amplifier 23 provides for constant Vout.

Figure 2:
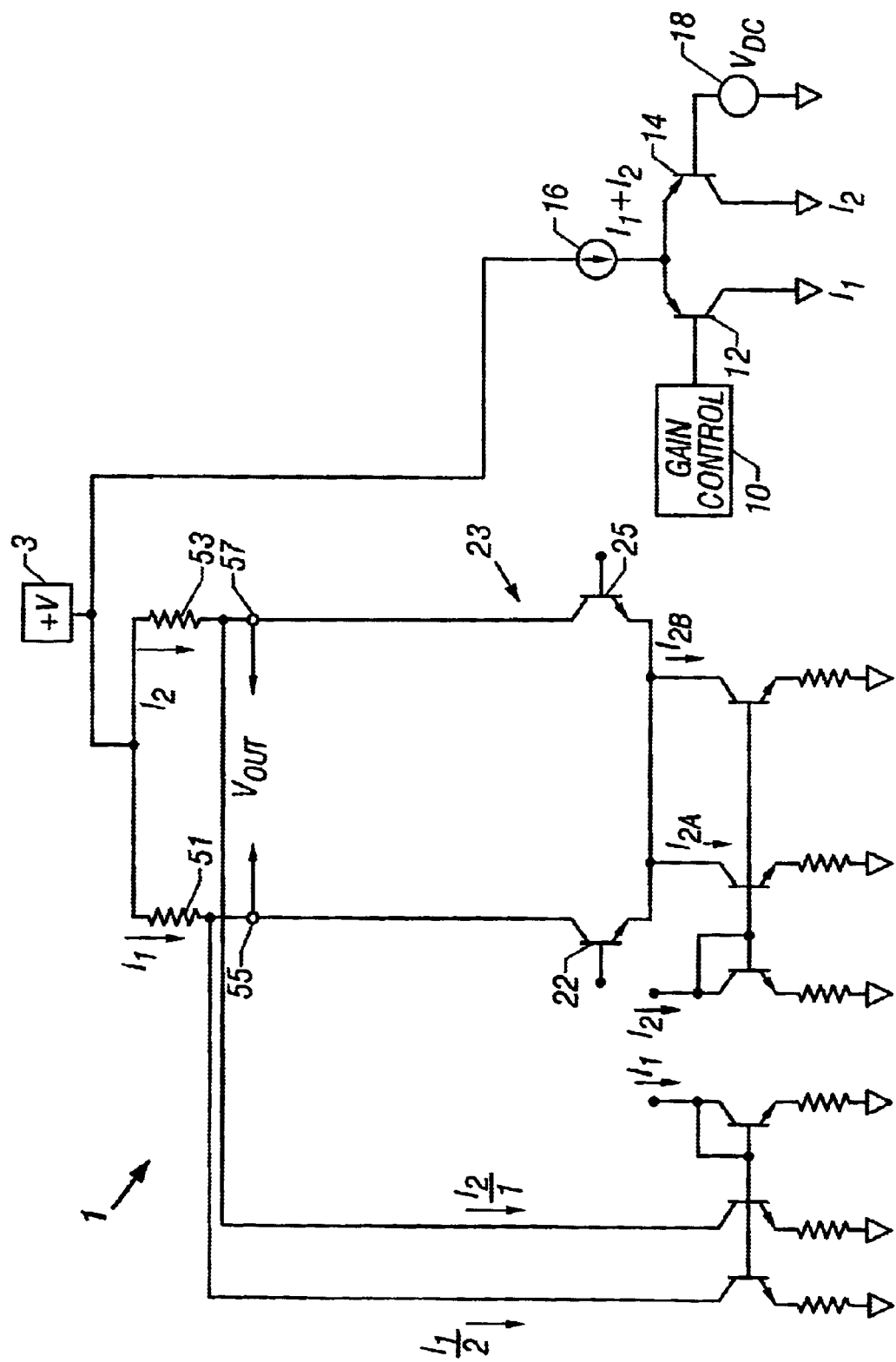
FIG. 2 is an schematic diagram of a variable gain amplifier constructed in accordance with the present invention.

FIG. 2 is a schematic illustration of an amplifier that does not comprise a mixer cell. In FIG. 2, the same reference numerals are used to denote components corresponding to those of the embodiment of FIG. 1. In FIG. 2, operation corresponds to that of the embodiment of FIG. 1.

The specification has been written with a view toward enabling those skilled in the art to produce many variations in the circuit particularly described to provide a variable gain mixer or amplifier with a fixed DC output operating voltage level in accordance with the present invention.

What is claimed is:

1. An amplifying stage comprising:
   a differential pair of amplifying transistors having a first output terminal and a second output terminal coupled to corresponding electrodes of first and second transistors in said differential pairs;
   first and second supply resistors coupled to each said output terminal for connection to a source;
   a load circuit connected between the differential amplifier and ground;
   second and third load circuits each connected between said first and second output terminals and ground respectively; and
   a current divider for connection to a substantially constant current source, providing a current I, said current divider dividing said source current I into first and second currents I1 and I2, a proportion of I1 to I2 being determined by a gain control circuit the current I1 being provided to a first current source load circuit and the current I2 being provided to a second current source load circuit, said first load circuit being connected to said second current load circuit to mirror I2, and said second load circuit being connected to said first current load circuit to mirror I1.

2. The amplifying stage according to claim 1 wherein said current I2 is high when gain is high and wherein said current I1 is higher than I2 when gain is low.

3. The amplifying stage according to claim 2 wherein said first and second current load circuits comprise transistors with their collectors and bases connected together and wherein their base emitter circuits are coupled to ground.

4. The amplifying stage according to claim 3 wherein each of said load circuits comprises a collector-emitter circuit of a transistor and wherein the base on said load circuit transistors are each connected to the base of the transistor whose current they are monitoring.

5. The amplifying stage according to claim 3 wherein said current mirror circuit mirroring the current I1 comprises first and second paths each connected to one output terminal of said amplifying stage, each conducting a current I1/I2.

6. The amplifying stage according to claim 5 comprising a Gilbert cell mixer connected between said output terminals and said differential amplifier pair.

7. The amplifying stage according to claim 4 wherein said I/2 mirror circuit comprises first and second paths each in series with one differential amplifier providing currents I2A and I2B, and wherein I2A and I2B=I2.

8. A method to provide constant output voltage operating point of a differential amplifier comprising the steps of providing a current source providing a current I, dividing the current I into first and second currents I1 and I2 through separate paths performing current relative magnitude in proportion to magnitude of a gain control signals; mirroring said currents I1 and I2 in first and second current paths, establishing current paths including said second mirror currents circuit between said differential amplifier and ground and providing a current path including said first mirroring current circuit between output terminals of said differential amplifier circuit and ground, varying the mirror currents in accordance with the first and second current paths and increasing the current flow in the first mirror paths as the current flow in the second mirror paths decreases to provide a constant current between the output terminals of said amplifier stage and ground.

9. The method according to claim 8 wherein the step of providing current paths in said first mirroring circuit comprises establishing current paths from each said output terminal through first and second transistors, commonly controlled with said first mirroring device respectively setting the currents in path to I1/2 and I1/2.

10. The method according to claim 9 wherein mirroring I1 comprises providing first and second paths between first and second output terminals of said differential pair of amplifying resistors and providing a current of I1/2 in each path.

11. The method according to claim 10 wherein mirroring currents I1 and I2 comprises providing load circuits respectively connected to sources providing currents I1 and I2.

* * * * *